(12) United States Patent
Suzuki (10) Patent No.: US 9,397,653 B2
(45) Date of Patent: Jul. 19, 2016

(54) SEMICONDUCTOR DEVICE (71) Applicant: Kabushiki Kaisha Toshiba, Minato-ku, Tokyo (JP)

(72) Inventor: Sen Suzuki, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 14/465,387

(22) Filed: Aug. 21, 2014

(65) Prior Publication Data

US 2015/0229304 A1  Aug. 13, 2015

(30) Foreign Application Priority Data

Feb. 13, 2014 (JP) ................................ 2014-025461

(51) Int. Cl.
| | | |
|---|---|---|
| *H03L 7/00* | (2006.01) | |
| *H03K 17/22* | (2006.01) | |
| *G05F 1/56* | (2006.01) | |
| *G05F 1/565* | (2006.01) | |
| *G06F 1/26* | (2006.01) | |

(52) U.S. Cl.
CPC ............... *H03K 17/223* (2013.01); *G05F 1/56* (2013.01); *G05F 1/565* (2013.01); *G06F 1/26* (2013.01)

(58) Field of Classification Search
None
See application file for complete search history.

(56) References Cited

U.S. PATENT DOCUMENTS

| | | | | |
|---|---|---|---|---|
| 5,818,271 A | * | 10/1998 | Stanojevic | H03K 17/22 323/315 |
| 6,469,480 B2 | * | 10/2002 | Kanakubo | G05F 1/565 323/269 |
| 8,120,338 B2 | | 2/2012 | Kawagishi et al. | |
| 8,415,993 B1 | * | 4/2013 | Newman | H03L 5/00 327/142 |
| 9,188,999 B2 | * | 11/2015 | Lee | G05F 1/10 |
| 2005/0068092 A1 | * | 3/2005 | Sano | G05F 1/575 327/541 |
| 2009/0033310 A1 | * | 2/2009 | Erbito, Jr. | G05F 1/56 323/313 |
| 2009/0322297 A1 | * | 12/2009 | Shiota | G05F 1/59 323/282 |
| 2015/0180326 A1 | * | 6/2015 | Motojima | H02M 1/32 323/282 |

FOREIGN PATENT DOCUMENTS

| | | |
|---|---|---|
| JP | 2009-146130 A | 7/2009 |
| JP | 2013-025577 A | 2/2013 |

* cited by examiner

*Primary Examiner* — Tuan T Lam
(74) *Attorney, Agent, or Firm* — White & Case LLP (57) ABSTRACT

According to one embodiment, the semiconductor device includes a power-on reset circuit and a constant voltage generation circuit. The power-on reset circuit generates a power-on reset signal to initialize an internal circuit when power supply is turned on. The constant voltage generation circuit supplies an output voltage to the internal circuit. The constant voltage generation circuit includes a differential amplifier, a first MOS transistor, a second MOS transistor, a switch, and a pull-up unit. The pull-up unit is provided between the power supply input terminal and the gate terminal of the second MOS transistor. The pull-up unit controls a voltage applied to the gate terminal of the second MOS transistor in accordance with the power-on reset signal.

11 Claims, 6 Drawing Sheets

SEMICONDUCTOR DEVICE

CROSS REFERENCE TO RELATED APPLICATION

This application is based upon and claims the benefit of priority from the prior Japanese Patent Application No. 2014-025461, filed on Feb. 13, 2014 the entire contents of which are incorporated herein by reference.

FIELD

Embodiments described herein relate to a semiconductor device.

BACKGROUND

A constant voltage power supply circuit incorporated in a semiconductor integrated circuit supplies a power supply having a stable voltage to an internal circuit. The constant voltage power supply circuit has an output MOS transistor, for example, and controls a gate voltage of the output MOS transistor on the basis of a difference voltage between a reference voltage and a feedback voltage obtained by dividing an output voltage, to make the output voltage constant.

The constant voltage power supply circuit described above has a problem that a rush current flows through the output MOS transistor when power supply is turned on.

DETAILED DESCRIPTION

According to one embodiment, the semiconductor device includes a power-on reset circuit and a constant voltage generation circuit. The power-on reset circuit generates a power-on reset signal to initialize an internal circuit when a power supply is turned on. The constant voltage generation circuit supplies an output voltage to the internal circuit. The constant voltage generation circuit includes a differential amplifier, a first MOS transistor, a second MOS, a switch, and a pull-up unit. The differential amplifier outputs a voltage depending upon a difference between a reference voltage and a feedback voltage obtained by dividing an output voltage. The first MOS transistor has a first terminal connected to a power supply input terminal supplied with a power supply voltage, a second terminal connected to an output terminal to output an output voltage, and a gate terminal connected to an output side of the differential amplifier. The second MOS transistor has a first terminal connected to the power supply input terminal and a second terminal connected to the output terminal, the second MOS transistor is connected in parallel with the first MOS transistor. The switch is provided between the output side of the differential amplifier and a gate terminal of the second MOS transistor to control opening/closing between the output side of the differential amplifier and the gate terminal of the second MOS transistor in accordance with the power-on reset signal. The pull-up unit is provided between the power supply input terminal and the gate terminal of the second MOS transistor to control a voltage applied to the gate terminal of the second MOS transistor in accordance with the power-on reset signal.

Hereafter, a plurality of embodiments will be described with reference to the drawings. In the drawings, the same reference characters denote the same or like portions.

Figure 1:
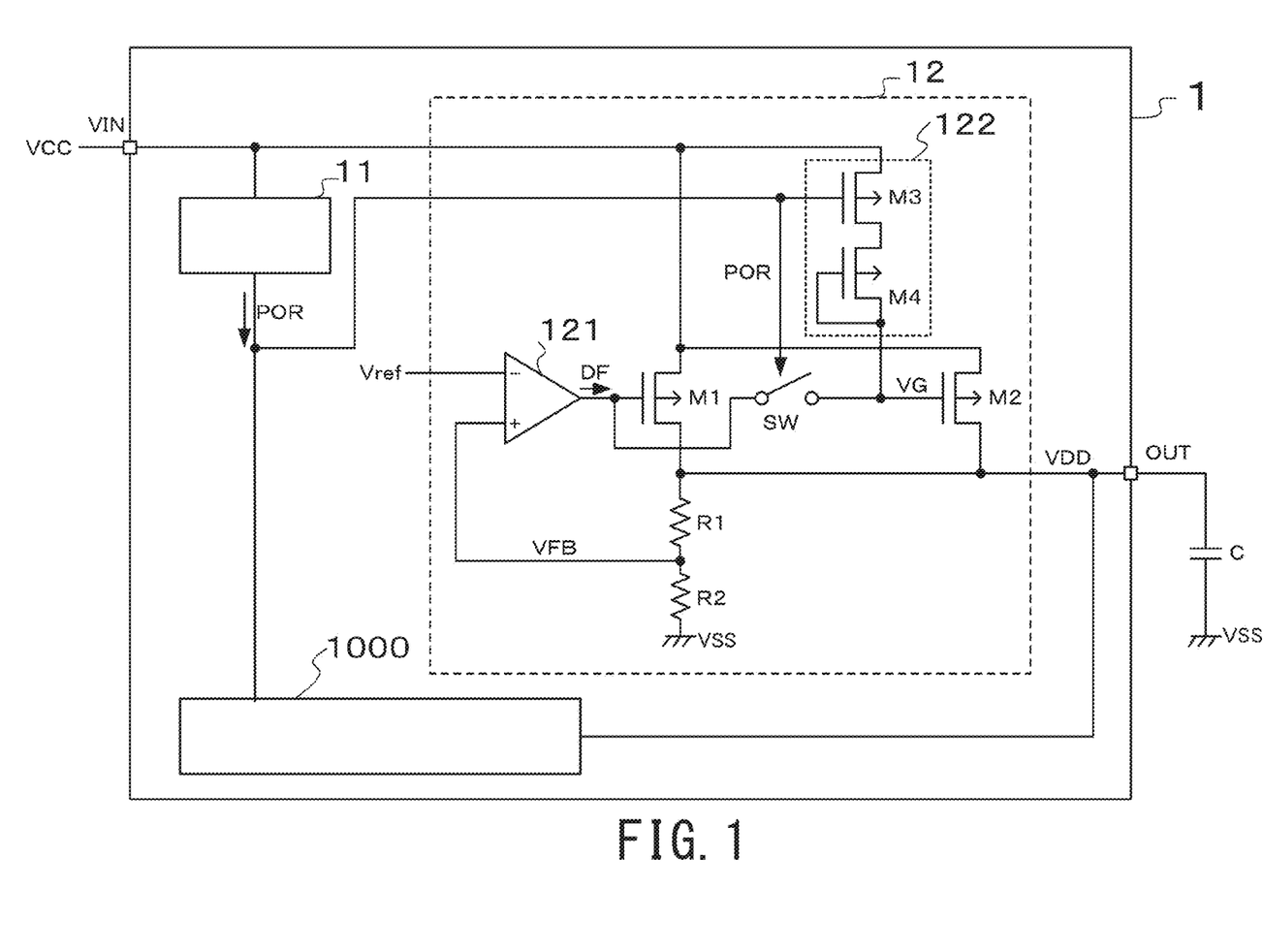
FIG. 1 is a block diagram showing a configuration of a semiconductor device according to a first embodiment.

A first embodiment of the invention will be described with reference to FIGS. 1 to 4. FIG. 1 is a block diagram showing a configuration of a semiconductor device according to the first embodiment. A semiconductor integrated circuit is provided in the semiconductor device according to the embodiment. A constant voltage generation circuit is incorporated in the semiconductor integrated circuit to supply a stable voltage to an internal circuit. A rush current flowing through the constant voltage generation circuit is suppressed when power supply is turned on.

A semiconductor integrated circuit 1 includes a power-on reset circuit 11 and a constant voltage generation circuit 12. The semiconductor device including the semiconductor integrated circuit 1 is applied to a mobile terminal, a digital camera, a notebook personal computer, a mobile electronic device, and the like.

When a power supply voltage VCC input to a power supply input terminal VIN is turned on, the power-on reset circuit 11 generates a power-on reset signal POR to initialize an internal circuit 1000.

In the embodiment, a reset state is brought about when the power-on reset signal POR is at a "low" level. When the power-on reset signal POR becomes a "high" level, the reset state is canceled.

The constant voltage generation circuit 12 steps down a power supply voltage VCC as a constant voltage power supply circuit, and supplies an output voltage VDD of constant voltage to the internal circuit 1000.

The constant voltage generation circuit 12 includes a differential amplification unit 121, a pull-up unit 122, a P-channel MOS transistor M1, a P-channel MOS transistor M2, a switch SW, a resistor R1, and a resistor R2.

A reference voltage Vref is input to a (−) port on an input side of the differential amplification unit 121. A feedback voltage VFB is input to a (+) port on the input side of the differential amplification unit 121. The differential amplification unit 121 outputs a voltage depending upon a difference between the reference voltage Vref and the feedback voltage VFB.

A first terminal of the P-channel MOS transistor M1 is connected to the power supply input terminal VIN. A second terminal of the P-channel MOS transistor M1 is connected to an output terminal OUT. A gate terminal of the P-channel MOS transistor M1 is connected to an output side of the differential amplifier 121. The P-channel MOS transistor M2 is disposed in parallel with the P-channel MOS transistor M1. A first terminal of the P-channel MOS transistor M2 is connected to the power supply input terminal VIN. A second terminal of the P-channel MOS transistor M2 is connected to the output terminal OUT.

The switch SW is provided between the output side of the differential amplifier 121 and a gate terminal of the P-channel MOS transistor M2. The switch SW controls opening/closing between the output side of the differential amplifier 121 and the gate terminal of the P-channel MOS transistor M2 in accordance with the power-on reset signal POR. When the power-on reset signal POR is at a "low" level (reset state), the switch SW opens a path between the output side of the differential amplifier 121 and the gate terminal of the P-channel MOS transistor M2. When the power-on reset signal POR is at a "high" level (reset cancel), the switch SW forms a path between the output side of the differential amplifier 121 and the gate terminal of the P-channel MOS transistor M2. As for the switch SW, an N-channel MOS transistor, a transfer gate, or the like, for example, is used.

The pull-up unit 122 is provided between the power supply input terminal VIN and the gate terminal of the P-channel MOS transistor M2. Pull-up operation is controlled by the power-on reset signal POR. The pull-up unit 122 includes a P-channel MOS transistor M3 and a P-channel MOS transistor M4. A first terminal of the P-channel MOS transistor M3 is connected to the power supply input terminal VIN. The power-on reset signal POR is input to a gate terminal of the P-channel MOS transistor M3. A first terminal of the P-channel MOS transistor M4 is connected to a second terminal of the P-channel MOS transistor M3. A gate terminal of the P-channel MOS transistor M4 is connected to a second terminal of the P-channel MOS transistor M4. The second terminal of the P-channel MOS transistor M4 is connected to the gate terminal of the P-channel MOS transistor M2. The P-channel MOS transistor M4 is a diode-connected transistor. The pull-up operation is an operation to control a voltage applied to the gate terminal of the P-channel MOS transistor M2.

In the pull-up unit 122, the P-channel MOS transistor M3 is in the on-state when the power-on reset signal POR is at the "low" level. The P-channel MOS transistor M3 is in the off-state when the power-on reset signal POR is at the "high" level.

A first terminal of the resistor R1 is connected to the second terminal of the MOS transistor M1 and the output terminal OUT. A first terminal of the resistor R2 is connected to a second terminal of the resistor R1. A second terminal of the resistor R2 is connected to a low potential side power supply (ground potential) VSS. The resistor R1 and the resistor R2 generate the feedback voltage VFB by dividing the output voltage VDD with resistors.

A capacitor C is provided outside the semiconductor integrated circuit 1. A first terminal of the capacitor C is connected to the output terminal OUT. A second terminal of the capacitor C is connected to the low potential side power supply (ground potential) VSS. The capacitor C stabilizes the output voltage VDD.

In the embodiment, the P-channel MOS transistor M1 and the P-channel MOS transistor M2 are disposed in parallel between the power supply input terminal VIN and the output terminal OUT.

The gate terminal of the P-channel MOS transistor M1 is connected to the output side of the differential amplifier 121. Therefore, the P-channel MOS transistor M1 is controlled to turn on/off by an output signal DF of the differential amplifier 121.

The gate terminal of the P-channel MOS transistor M2 is connected to the output side of the differential amplifier 121 via the switch SW, and is connected to the power supply voltage VCC via the pull-up unit 122.

Both the switch SW and the P-channel MOS transistor M3 in the pull-up unit 122 are controlled by the power-on reset signal POR. When the power supply voltage VCC is supplied, therefore, the switch SW and the pull-up unit 122 are interlocked in operation.

When the power supply voltage VCC is supplied, the switch SW is open and the P-channel MOS transistor M3 in the pull-up unit 122 is on, while the power-on reset signal POR is at the "low" level. At this time, the gate terminal of the P-channel MOS transistor M2 is pulled up to the power supply voltage VCC via the pull-up unit 122. A gate voltage VG of the P-channel MOS transistor M2 assumes a pull-up level. As a result, the P-channel MOS transistor M2 turns off.

When the power-on reset signal POR changes to the "high" level thereafter, the P-channel MOS transistor M3 in the pull-up unit 122 turns off and the switch SW connects the output side of the differential amplifier 121 to the gate terminal of the P-channel MOS transistor M2. Therefore, the gate terminal of the P-channel MOS transistor M2 is connected to the output side of the differential amplifier 121. As a result, the P-channel MOS transistor M2 is also controlled by the output signal of the differential amplifier 121.

Figure 2:
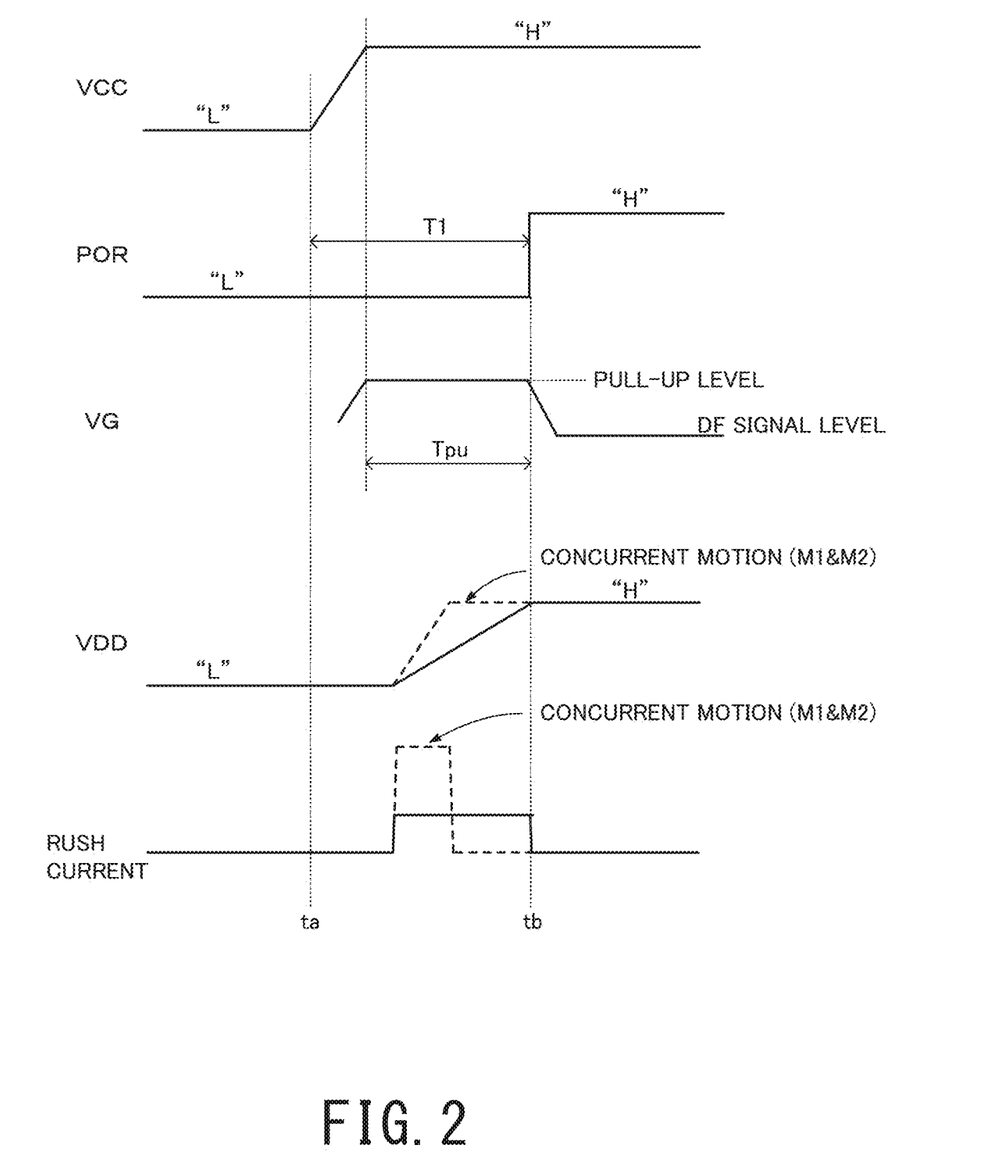
FIG. 2 is a timing chart showing an operation of the semiconductor device according to the first embodiment.

FIG. 2 is a timing chart showing an operation of the constant voltage generation circuit 12 at the time when the power supply voltage VCC is supplied.

When the power supply voltage VCC is supplied at time to as shown in FIG. 2, the power-on reset signal POR keeps the "low" level for a period T1.

For the period T1 of the "low" level of the power-on reset signal POR after the power supply voltage VCC is supplied, the switch SW opens the path between the output side of the differential amplifier 121 and the gate terminal of the P-channel MOS transistor M2. Since the P-channel MOS transistor M3 in the pull-up unit 122 turns on, the gate voltage VG of the P-channel MOS transistor M2 becomes a pull-up level.

For a pull-up period Tpu, the P-channel MOS transistor M2 turns off and only the P-channel MOS transistor M1 is turned on by the output signal DF of the differential amplifier 121.

As a result, load driving power of the constant voltage generation circuit 12 becomes lower as compared with a case where the P-channel MOS transistor M1 and the P-channel MOS transistor M2 operate in parallel. Therefore, a change of the output voltage VDD of the constant voltage generation circuit 12 becomes gentle.

Only the P-channel MOS transistor M1 charges the capacitor C connected to the output terminal OUT. In the embodiment, a rush current mostly occupied by the charging current can be suppressed as compared with a case where the P-channel MOS transistor M1 and the P-channel MOS transistor M2 operate in parallel.

When the power-on reset signal POR changes to the "high" level at time tb, the switch SW connects the output side of the differential amplifier 121 to the gate terminal of the P-channel MOS transistor M2. Since the P-channel MOS transistor M3 turns off, the pull-up unit 122 stops the output to the gate terminal of the P-channel MOS transistor M2. As a result, the P-channel MOS transistor M2 is controlled by the output signal DF of the differential amplifier 121. In an normal operation after the power-on reset is canceled, therefore, the P-channel MOS transistor M1 and the P-channel MOS transistor M2 in the constant voltage generation circuit 12 operate in parallel and drive the load.

Figure 3:
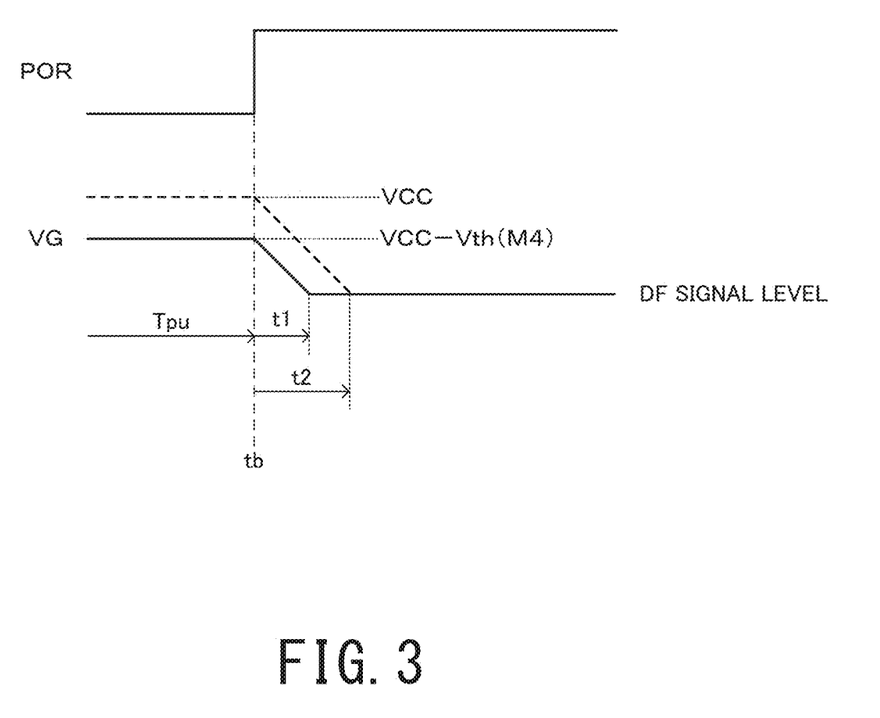
FIG. 3 is a timing chart showing an operation of a pull-up unit in the semiconductor device according to the first embodiment.

FIG. 3 is a timing chart showing how the gate voltage VG of the P-channel MOS transistor M2 changes at the time of shift from the pull-up period Tpu to the normal operation.

In the pull-up unit 122 shown in FIG. 1, the diode-connected P-channel MOS transistor M4 is connected in series with the P-channel MOS transistor M3. For the pull-up period Tpu, therefore, the gate voltage VG of the P-channel MOS transistor M2 becomes VCC-Vth(M4). Here, Vth(M4) is a threshold voltage of the P-channel MOS transistor M4.

At the time of shift from the pull-up period Tpu to the normal operation, therefore, the gate voltage VG of the P-channel MOS transistor M2 changes from VCC-Vth(M4) in the pull-up period Tpu to a signal level of the output signal DF of the differential amplifier 121.

As shown in FIG. 3, it is supposed that time required for the change is a period t1. The period t1 becomes shorter than a period t2 required for a change in a case where the pull-up level is set equal to VCC, for example (t1<t2).

In the embodiment, it is possible to shorten the shift time of the constant voltage generation circuit 12 to the normal operation by lowering the pull-up level by use of the diode-connected P-channel MOS transistor M4.

Figure 4:
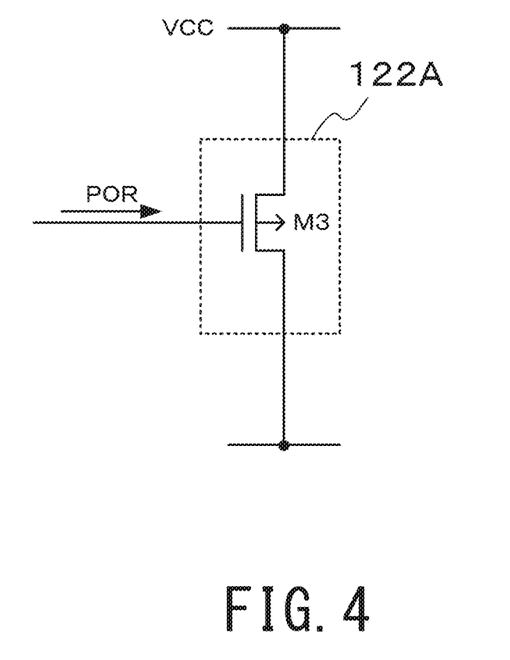
FIG. 4 is a circuit diagram showing a different configuration of the pull-up unit in the semiconductor device according to the first embodiment.

By the way, the pull-up unit 122 may be replaced by a pull-up unit 122A shown in FIG. 4. A P-channel MOS transistor M3 having a gate terminal supplied with the power-on reset signal POR is provided in the pull-up unit 122A. Therefore, the number of elements can be reduced as compared with the pull-up unit 122.

In the case of the pull-up unit 122A shown in FIG. 4, the pull-up level rises as compared with the pull-up unit 122. As compared with the case where the pull-up unit 122 is used, therefore, the time required to shift from the pull-up period to the normal operation becomes long.

According to the semiconductor integrated circuit in the embodiment, it is possible to pull up a gate terminal of one of two output P-channel MOS transistors connected in parallel in the constant voltage generation circuit when the power supply is turned on, by utilizing the power-on reset signal generated to initialize the internal circuit when the power supply is turned on, as described above. Therefore, the load driving power of the constant voltage generation circuit at the time when the power supply is turned can be lowered, and the rush current flowing through the constant voltage generation circuit can be suppressed.

Furthermore, the pull-up level can be made lower than the power supply voltage by forming the pull-up generation unit as the series connection circuit including the P-channel MOS transistor controlled in conduction by the power-on reset signal and the diode-connected P-channel transistor. As a result, the shift time of the constant voltage generation circuit from the pull-up period to the normal operation can be shortened.

Figure 5:
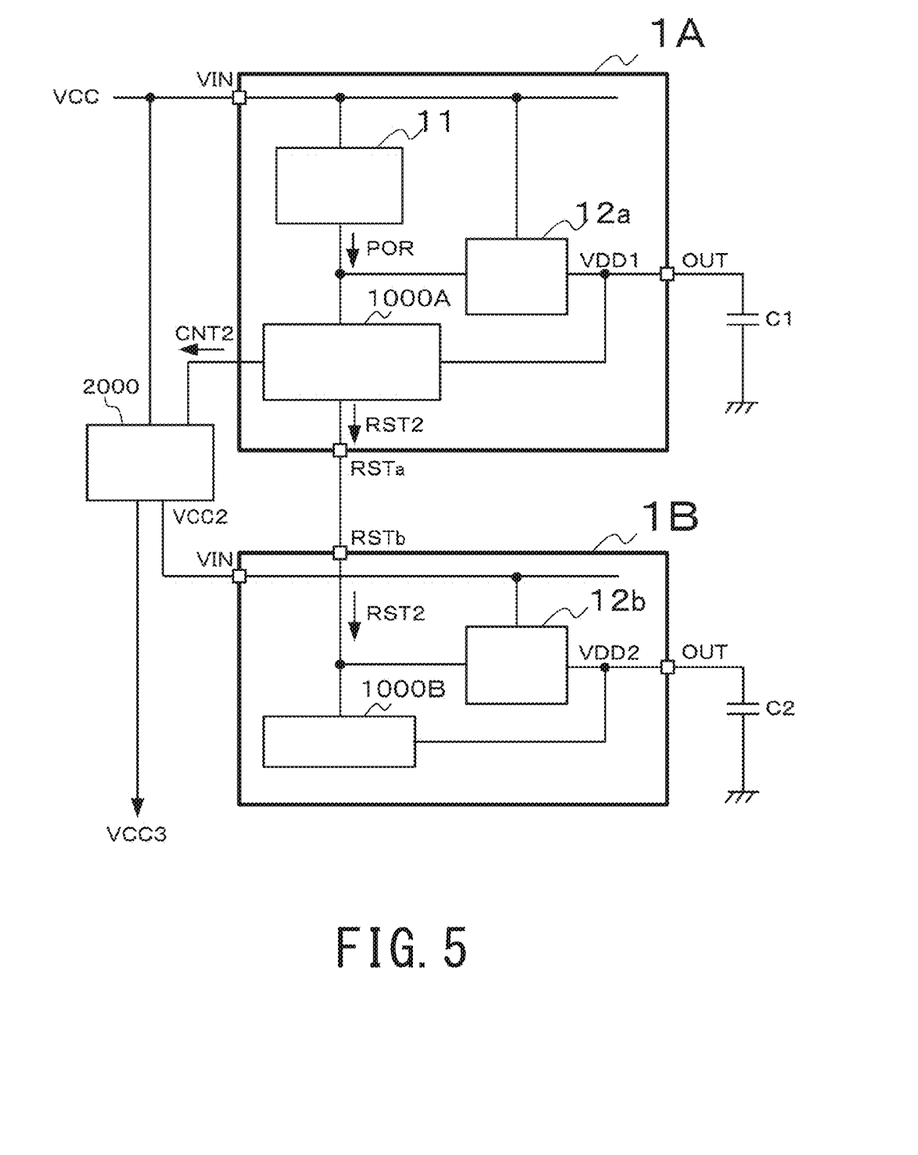
FIG. 5 is a block diagram showing a configuration of a semiconductor device according to a second embodiment.

A second embodiment of the invention will be described with reference to FIGS. 5 and 6. FIG. 5 is a block diagram showing an example of a configuration of a semiconductor device according to the second embodiment. In the semiconductor device according to the embodiment, a power-on reset circuit and a first constant voltage generation circuit are provided in a first semiconductor integrated circuit, a second constant voltage generation circuit is provided in a second semiconductor integrated circuit, and rush currents flowing through the first and second constant voltage generation circuits are suppressed by using the power-on reset circuit.

The semiconductor device according to the embodiment includes a semiconductor integrated circuit 1A (the first semiconductor integrated circuit), a semiconductor integrated circuit 1B (the second semiconductor integrated circuit), and a power supply control unit 2000.

The semiconductor integrated circuit 1A includes a power-on reset circuit 11, and a constant voltage generation circuit 12a (a first constant voltage generation circuit). The constant voltage generation circuit 12a generates an output voltage VDD1 supplied to an internal circuit 1000A, as a constant voltage power supply circuit. The constant voltage generation circuit 12a has a circuit configuration similar to that of the constant voltage generation circuit 12 in the first embodiment.

The power-on reset circuit 11 generates a power-on reset signal POR to initialize the internal circuit 1000A when the power supply voltage VCC is turned on.

The internal circuit 1000A has a control function of a system including the semiconductor integrated circuit 1A, the semiconductor integrated circuit 1B, and the power supply control unit 2000. The internal circuit 1000A outputs a control signal CNT2 to the power supply control unit 2000 to control power supply start. The internal circuit 1000A outputs a reset signal RST2 to the semiconductor integrated circuit 1B via an output terminal RSTa of the semiconductor integrated circuit 1A and an input terminal RSTb of the semiconductor integrated circuit 1B.

The internal circuit 1000A controls timing of the reset signal RST2 to cancel the reset when a predetermined time has elapsed after bringing about the control signal CNT2 into an enable state.

When a power supply voltage VCC is supplied, the power supply control unit 2000 supplies a power supply voltage VCC2 to the semiconductor integrated circuit 1B. At this time, the power supply control unit 2000 controls rising of the power supply voltage VCC2 supplied to the semiconductor integrated circuit 1B, under control from the control signal CNT2 output from the semiconductor integrated circuit 1A.

The power supply control unit 2000 supplies a power supply voltage VCC3 to another semiconductor integrated circuit that is not illustrated.

The semiconductor integrated circuit 1B includes a constant voltage generation circuit 12b (a second constant voltage generation circuit). The constant voltage generation circuit 12b generates an output voltage VDD2 supplied to the internal circuit 1000B, as the constant voltage power supply circuit.

The constant voltage generation circuit 12b has a circuit configuration similar to that of the constant voltage generation circuit 12 in the first embodiment.

The semiconductor integrated circuit 1B is supplied with the power supply voltage VCC2 from the power supply control unit 2000. The reset signal RST2 is input to the semiconductor integrated circuit 1B via the output terminal RSTa of the semiconductor integrated circuit 1A.

In the semiconductor integrated circuit 1B, the reset signal RST2 input from the semiconductor integrated circuit 1A is input to the constant voltage generation circuit 12b and the internal circuit 1000B.

The constant voltage generation circuit 12b in the semiconductor integrated circuit 1B controls the gate voltage VG of the P-channel MOS transistor M2 by using the reset signal RST2. The reset signal RST2 controls the gate voltage VG of the P-channel MOS transistor M2 in the same way as the power-on reset signal POR in the first embodiment. Since operation of the constant voltage generation circuit 12a and the constant voltage generation circuit 12b is the same as the operation of the constant voltage generation circuit 12 in the first embodiment, detailed description of the operation of the constant voltage generation circuit 12a and the constant voltage generation circuit 12b will be omitted.

Figure 6:
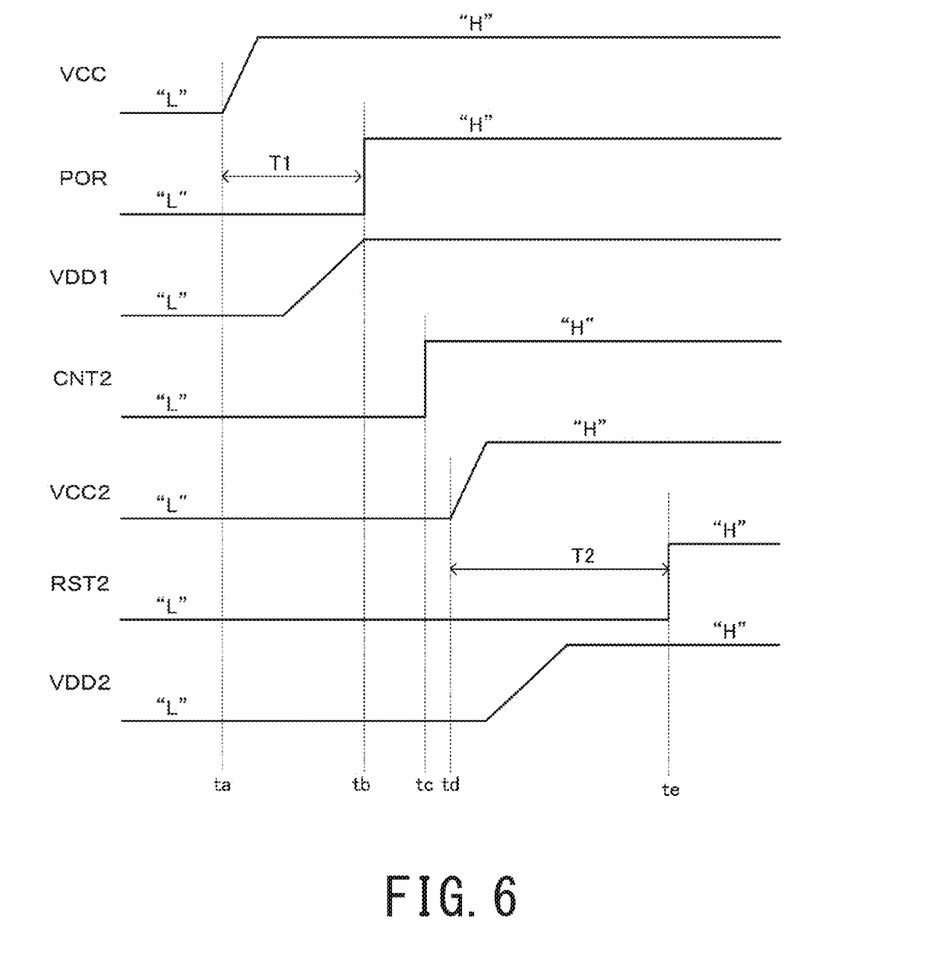
FIG. 6 is a timing chart showing an operation of the semiconductor device according to the second embodiment.

FIG. 6 is a timing chart showing an operation of the semiconductor device according to the embodiment.

When the power supply voltage VCC (first power supply voltage) is supplied to the semiconductor integrated circuit 1A at time ta, the power-on reset signal POR keeps a "low" level for a period T1 as shown in FIG. 6.

For the period T1 of the "low" level, the gate voltage VG of the P-channel MOS transistor M2 becomes a pull-up level.

When the power supply voltage VCC is supplied to the semiconductor integrated circuit 1A, the power-on reset signal POR becomes a "low" level for a determinate period. For a pull-up period Tpu, load driving power of the constant voltage generation circuit 12a is small, and consequently a change of the output voltage VDD1 of the constant voltage generation circuit 12a is gentle. As a result, a rush current flowing through the constant voltage generation circuit 12a in the semiconductor integrated circuit 1A can be suppressed.

After time tc, the internal circuit 1000A in the semiconductor integrated circuit 1A generates the control signal CNT2. In the control signal CNT2, a "high" level is an enable state.

In response to a change of the control signal CNT2 to the enable state, the power supply control unit 2000 supplies the power supply voltage VCC2 (second power supply voltage) to the constant voltage generation circuit 12b in the semiconductor integrated circuit 1B.

When a predetermined time has elapsed (at time te) after changing the control signal CNT2 to the enable state, the internal circuit 1000A in the semiconductor integrated circuit 1A changes the reset signal RST2 from a "low" level to a "high" level.

For a "low" level period T2 of the reset signal RST2 output from the internal circuit 1000A in the semiconductor integrated circuit 1A, load driving power of the constant voltage generation circuit 12b in the semiconductor integrated circuit 1B is small. Therefore, a change of the output voltage VDD2 of the constant voltage generation circuit 12b is gentle. As a result, a rush current flowing through the constant voltage generation circuit 12b in the semiconductor integrated circuit 1B can be suppressed.

According to the semiconductor device in the embodiment, the rush current flowing through the constant voltage generation circuit can be suppressed without providing a power-on reset circuit in the semiconductor integrated circuit mounting the constant voltage generation circuit, by utilizing the reset signal output from a different semiconductor integrated circuit, as described above.

According to a semiconductor device in at least one embodiment described heretofore, it is possible to suppress the rush current flowing through the constant voltage power supply circuit when the power supply is turned on.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a power-on reset circuit to generate a power-on reset signal to initialize an internal circuit when a power supply is turned on; and
    a constant voltage generation circuit to supply an output voltage to the internal circuit, wherein
    the constant voltage generation circuit includes a differential amplifier, a first MOS transistor, a second MOS transistor, a switch, and a pull-up unit,
    the differential amplifier outputs a voltage depending upon a difference between a reference voltage and a feedback voltage obtained by dividing the output voltage,
    the first MOS transistor has a first terminal connected to a power supply input terminal supplied with a power supply voltage provided by the power supply, a second terminal connected to an output terminal to output the output voltage, and a gate terminal connected to an output side of the differential amplifier,
    the second MOS transistor has a first terminal connected to the power supply input terminal and a second terminal connected to the output terminal, the second MOS transistor is connected in parallel with the first MOS transistor,
    the switch is provided between the output side of the differential amplifier and a gate terminal of the second MOS transistor to control opening/closing between the output side of the differential amplifier and the gate terminal of the second MOS transistor in accordance with the power-on reset signal, and
    the pull-up unit is provided between the power supply input terminal and the gate terminal of the second MOS transistor to control a voltage applied to the gate terminal of the second MOS transistor in accordance with the power-on reset signal.

2. The semiconductor device according to claim 1, wherein
    when the constant voltage generation circuit is in a reset state brought about by the power-on reset signal, the switch disconnects a path between the output side of the differential amplifier and the gate terminal of the second MOS transistor, and the pull-up unit applies a voltage of a pull-up level to the gate terminal of the second MOS transistor, and
    when the reset state in the constant voltage generation circuit brought about by the power-on reset signal is canceled, the switch connects the path between the output side of the differential amplifier and the gate terminal of the second MOS transistor, and an output from the pull-up unit to the gate terminal of the second MOS transistor is stopped.

3. The semiconductor device according to claim 1, wherein the pull-up unit comprises:
    a third MOS transistor having a first terminal connected to the power supply input terminal and a gate terminal supplied with the power-on reset signal as an input; and
    a fourth MOS transistor having a first terminal connected to a second terminal of the third MOS transistor and a gate terminal connected to a second terminal of the fourth MOS transistor and the gate terminal of the second MOS transistor.

4. The semiconductor device according to claim 3, wherein
    when the power-on reset signal is at a "low" level, the third MOS transistor turns on, and
    when the power-on reset signal is at a "high" level, the third MOS transistor turns off.

5. The semiconductor device according to claim 4, wherein the first to fourth MOS transistors are P-channel MOS transistors.

6. The semiconductor device according to claim 1, wherein the power-on reset circuit and the constant voltage generation circuit are provided in same semiconductor integrated circuit.

7. The semiconductor device according to claim 1, wherein the pull-up unit includes a third MOS transistor,
    the third MOS transistor has a first terminal connected to the power supply input terminal, a second terminal connected to the gate terminal of the second MOS transistor, and a gate terminal supplied with the power-on reset signal as an input.

8. The semiconductor device according to claim 7, wherein
when the power-on reset signal is at a "low" level, the third MOS transistor turns on, and
when the power-on reset signal is at a "high" level, the third MOS transistor turns off.

9. The semiconductor device according to claim 8, wherein the first to third MOS transistors are P-channel MOS transistors.

10. The semiconductor device according to claim 1, wherein the switch is any of an N-channel MOS transistor and a transfer gate.

11. The semiconductor device according to claim 1, wherein the semiconductor device is applied to a mobile terminal, a digital camera, a notebook personal computer, or a mobile electronic device.

* * * * *